United States Patent [19]

Hirayama et al.

[11] Patent Number: 4,833,650
[45] Date of Patent: May 23, 1989

[54] SEMICONDUCTOR MEMORY DEVICE INCLUDING PROGRAMMABLE MODE SELECTION CIRCUITRY

[75] Inventors: Kazutoshi Hirayama; Hideyuki Ozaki; Kazuyasu Fujishima; Hideto Hidaka, all of Hyogo, Japan

[73] Assignee: Mitsubishi Denki Kabushiki Kaisha, Tokyo, Japan

[21] Appl. No.: 34,094

[22] Filed: Apr. 2, 1987

[30] Foreign Application Priority Data

Jun. 23, 1986 [JP] Japan .................. 61-146687

[51] Int. Cl.⁴ ............................. G11C 7/00
[52] U.S. Cl. ................ 365/225.7; 365/230.01; 365/230.06; 307/202.1
[58] Field of Search .............. 365/230, 233, 189, 96, 365/226, 94; 307/202.1

[56] References Cited

U.S. PATENT DOCUMENTS

| | | | |
|---|---|---|---|
| 4,562,555 | 12/1985 | Ouchi et al. | 365/189 |
| 4,586,167 | 4/1986 | Fujishima et al. | 365/189 |
| 4,590,388 | 5/1986 | Clemons et al. | 307/202.1 |
| 4,685,084 | 8/1987 | Canepa | 365/230 |
| 4,789,966 | 12/1988 | Ozaki | 365/189 |

OTHER PUBLICATIONS

Nishikawa, "MSM411000/411001/414256(1M Bit Draw)", The Electronic Material, Jan. 1986, pp. 66–71.

Primary Examiner—Stuart N. Hecker
Assistant Examiner—Glenn A. Gossage
Attorney, Agent, or Firm—Wolf, Greenfield & Sacks

[57] ABSTRACT

A semiconductor memory device includes a plurality of operation mode control circuits provided on a memory chip of the device for respectively executing a corresponding plurality of writing/reading operation modes including at least a static column mode, a high speed page mode and a nibble mode, and a plurality of operation mode selection circuits provided on the memory chip, each of the operation mode selection circuits having a fuse element and a bonding pad for selecting one of the plurality of the operation mode control circuits when the fuse element is cut off or the bonding pad is selectively wired, so that various functions can be selectively effected on the same chip.

8 Claims, 4 Drawing Sheets

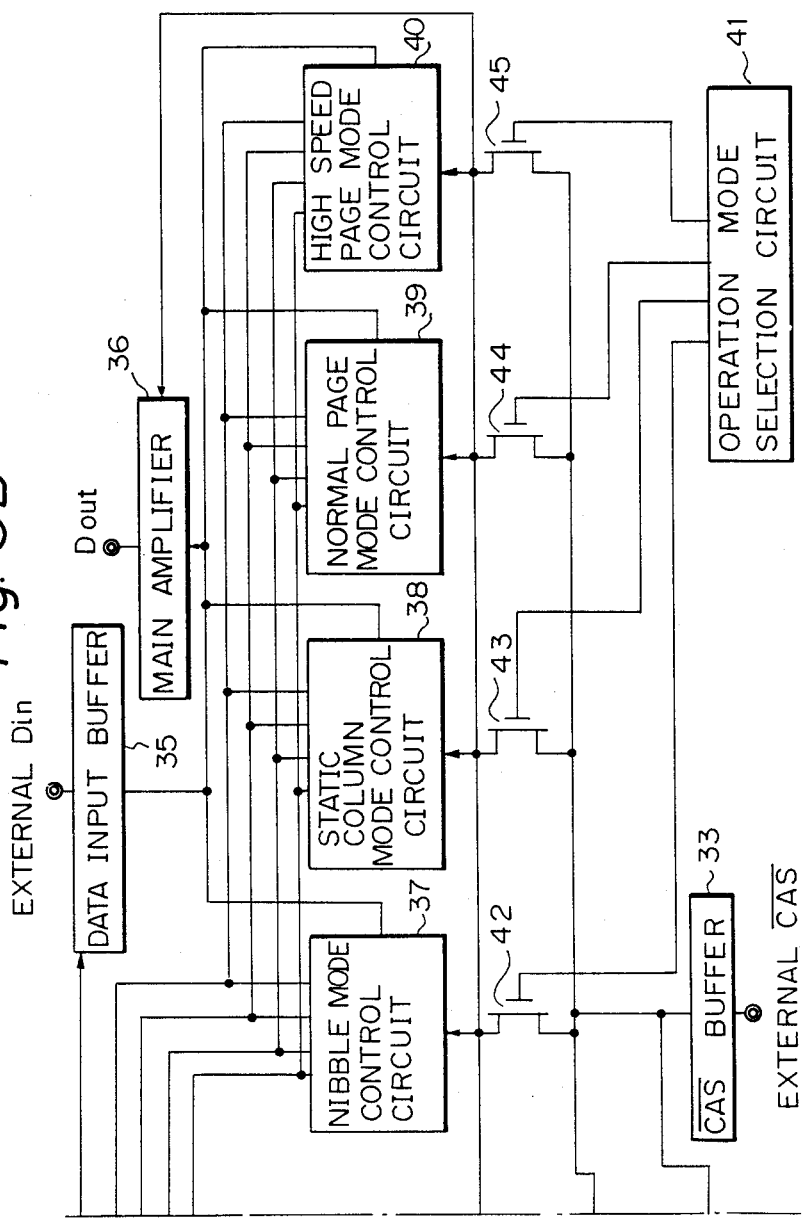

Fig. 4A PAGE MODE
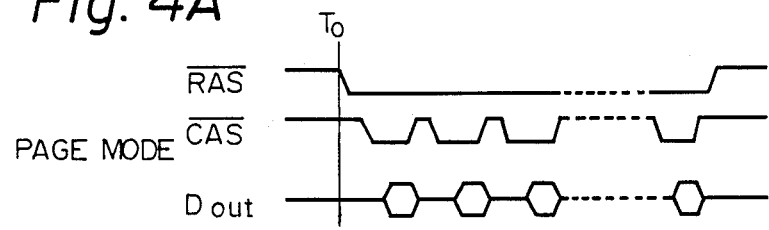
Fig. 4B STATIC COLUMN MODE
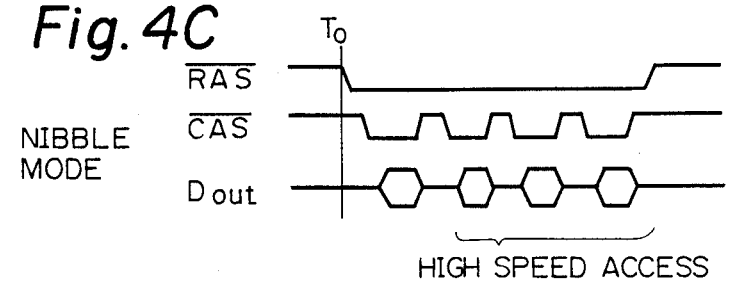
Fig. 4C NIBBLE MODE
HIGH SPEED ACCESS
Fig. 5
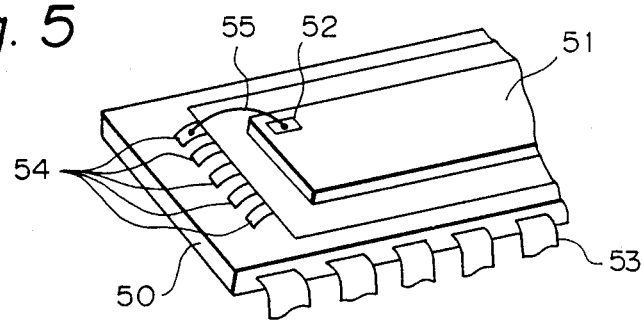

SEMICONDUCTOR MEMORY DEVICE INCLUDING PROGRAMMABLE MODE SELECTION CIRCUITRY

FIELD OF THE INVENTION

The present invention relates to a semiconductor memory device and in particular to a Dynamic Random Access Memory (hereinafter referred to as DRAM) which on its chip provides for more than two kinds of writing/reading operation modes including a static column mode, a high speed page mode, a nibble mode and the like in addition to a normal writing/reading operation mode which is a so-called normal page mode, so that various functions can be selectively effected on the same chip by selecting any one of the various operating modes.

PRIOR ART

In recent years, the DRAM's which have become commercially available can provide high speed writing/reading operation modes such as a high speed page mode, a nibble mode, a static column mode and the like, in addition to a normal page mode. In order to provide such DRAM's, the manufacturers of semiconductors generally designed such a circuit to be capable of providing plural kinds of operation modes on the same memory chips, and then selected one kind of operation mode out of these. In this way, they have avoided problems relating to design efficiency or mass-production efficiency when these DRAM's are executed on another chip.

In fact, the intended operation modes have been mainly selected by changing the masking employed in an aluminum-wiring process or the like or by providing wiring for a particular pad in an assembly process, and thus different chips can be correspondingly provided for the various operation modes.

However, there have been problems in that the prior art method of selecting operation modes in the production process of the semiconductor memory device may require the maskings to be changed each time the operation mode varies and this change of the masking used in the production process may prevent the manufacturer from complying quickly with the requirements of his customers and may also lead to increased inventories of chips having particular operation modes due to rapid changes in market requirements. It is particularly to be noted that as far as the semiconductor memory devices of recent days are concerned, the arrangement of pads has to be changed in response to the diversification of packages, while on the other hand changing of maskings in the wiring process causes a considerable increase in the required number of maskings in combination with the various packages.

It is also to be noted that the changes effected in the wiring process make it possible to quickly comply with market trends but that this method essentially necessitates the provision of many bonding pads on a chip and causes the area of the chip to be increased in relation to the layout thereof in accordance with the increased number of operation modes.

SUMMARY OF THE INVENTION

The disadvantages and problems described above can be overcome by the present invention.

It is an object of the present invention, therefore, to provide an improved semiconductor memory device in which an intended operating mode can be simply and quickly selected from a plurality of writing/reading operation modes on the same chip without unexpectedly increasing the number of maskings required in the wiring process or the area of the chip.

Another object of the present invention is to provide a semiconductor memory device characterized by having a plurality of operation mode control circuits provided on a memory chip of the device for respectively executing a corresponding plurality of writing/reading operation modes including at least a static column mode, a high speed page mode and a nibble mode, and a plurality of operation mode selection circuits provided on the memory chip, each of the operation mode selection circuits having a fuse element for selecting any one of the plurality of operation mode control circuits when the fuse element is cut off.

According to the semiconductor memory device of the present invention, it is possible to select the operation modes on the chip by cutting off fuse elements by means of a laser beam from an external laser trimmer apparatus or an electric current from an external power supply, in addition to the facility to change the pad wiring.

According to the present invention, since the selection of the operating modes can be effected by cutting off the fuse elements on the chip, the various types of chips or memory devices corresponding to the intended operation modes can be easily and quickly prepared without unnecessarily increasing the number of maskings employed in the wiring process or the area for the bonding pads.

According to the present invention, either of the two possible ways can be employed as the means of selecting any of the various operation modes, namely, (1) cutting off a fuse which minimizes the layout area of a chip and (2) wiring which enables a quick response to market requirements. As a result, it is not necessary to prepare the same number of bonding pads as there are operation modes in order to provide a chip capable of selecting any of the various operation modes and yet it remains possible to provide a means of selecting the operation modes which will not sacrifice the ability to respond quickly to the market.

These and other objects and advantages of the present invention will appear more clearly from the following detailed disclosure when read in conjunction with the accompanying drawings.

BRIEF EXPLANATION OF THE DRAWINGS

FIGS. 3, 3A, and 3B represent a block circuit diagram of a semiconductor memory device including the semiconductor selection circuit shown in either FIG. 1 or FIG. 2;

FIGS. 4(a)–4(c) represent charts showing the operation modes of the semiconductor memory device shown in FIG. 3, wherein FIG. 4(a) is a chart showing a page mode;

FIG. 4(b) is a chart showing a static column mode;

FIG. 4(c) is a chart showing a nibble mode; and

FIG. 5 is a schematic view showing an example of wiring.

PREFERRED EMBODIMENT OF THE INVENTION

Figure 1:
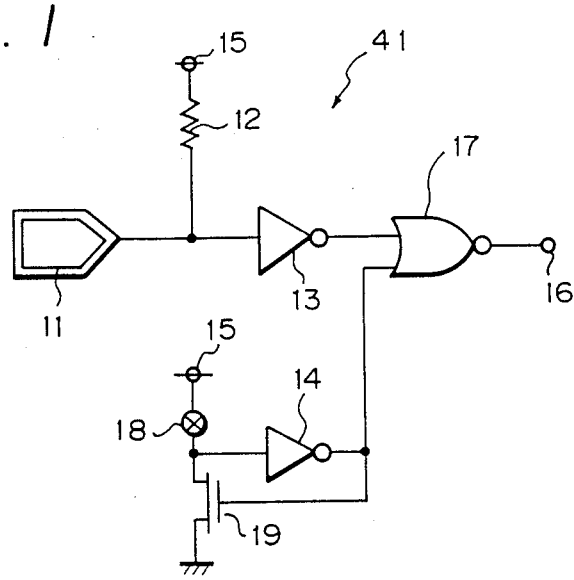
FIG. 1 is a circuit diagram showing an operation mode selection circuit in a semiconductor memory device according to an embodiment of the present invention.

FIG. 1 is a logic circuit diagram showing an operation mode selection circuit 41 in a semiconductor memory device according to an embodiment of the present invention. In FIG. 1, numeral 11 designates a bonding pad with wiring applied thereto, numeral 12 designates a pull-up resistor for ensuring a potential when the bonding pad is not wired, numerals 13 and 14 designate inverter circuits consisting of transistors and the like, numeral 15 designates a terminal connected to an electric power source (not shown), numeral 16 designates a node at which a high or low level signal functions to select any one of operation mode control circuits 37 to 40 which will be explained below, numeral 17 designates a NOR logic circuit consisting of transistors and the like, numeral 18 designates a fuse element which is adapted to be cut off by a laser beam from an external laser trimmer apparatus (not shown) and numeral 19 designates a transfer gate.

Figure 2:
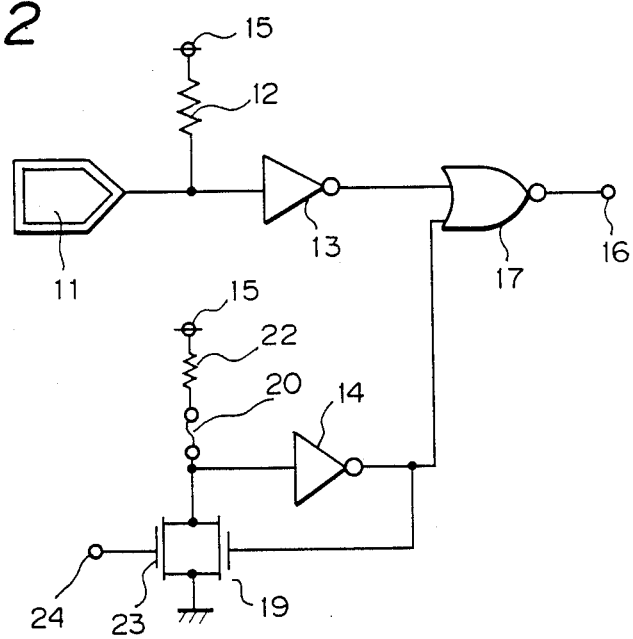
FIG. 2 is a circuit diagram showing an operation mode selection circuit in a semiconductor memory device according to another embodiment of the present invention.

FIG. 2 illustrates another embodiment of the present invention which makes it possible to select the operation modes either by an electric fuse or by changing the wiring. In FIG. 2, numeral 20 designates an electric fuse to be cut off by an electric current from an external power supply (not shown), and numeral 22 designates a resistor.

Figure 3A:
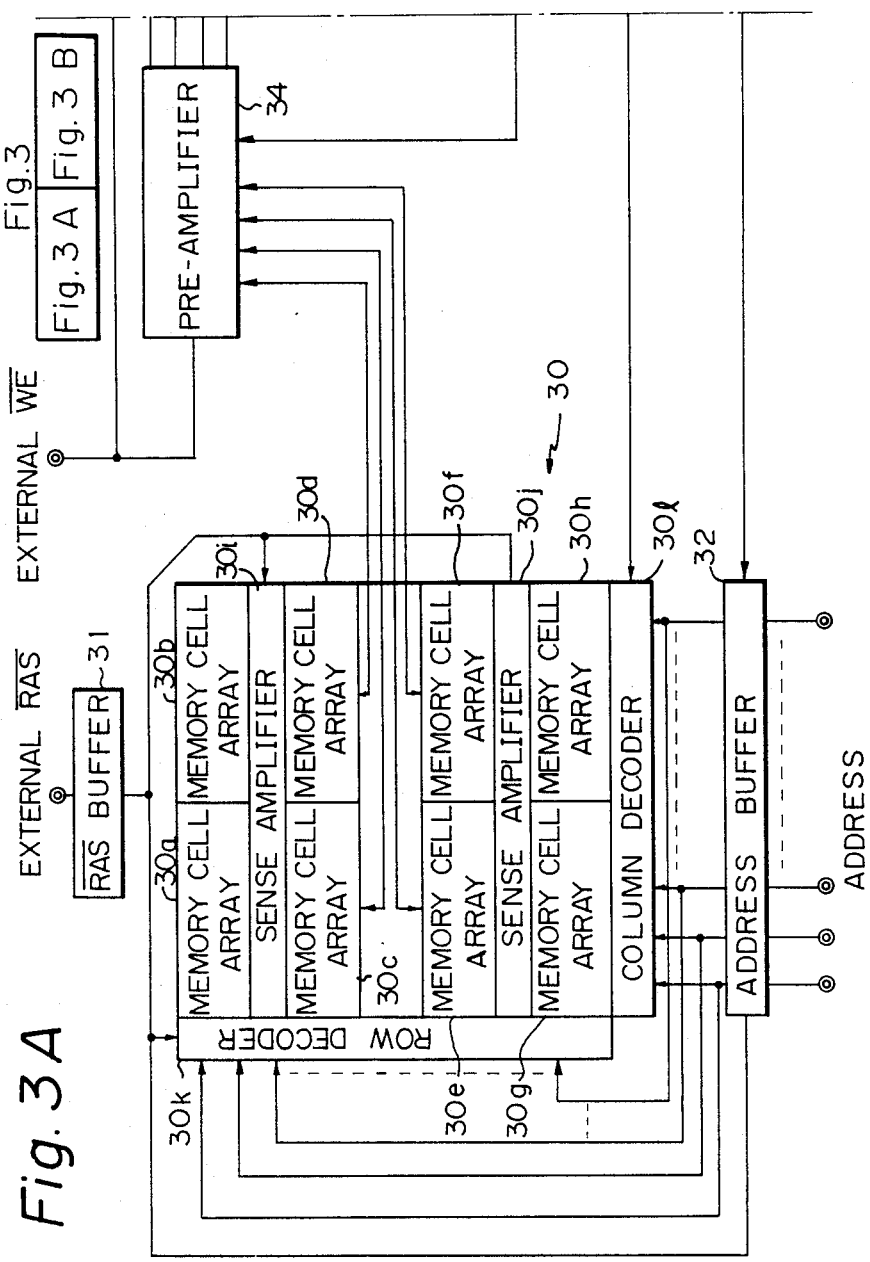

FIGS. 3, 3A, and 3B represent a block circuit diagram of a semiconductor memory device in which a plurality of operation modes can be provided by one chip. In FIGS. 3A and 3B, numeral 30 designates a memory cell array assembly incorporating memory cell arrays 30a through 30h divided into eight sections, sense amplifiers 30i and 30j, a row decoder 30k and a column decoder 30l. Further, numeral 31 designates an $\overline{RAS}$ buffer, numeral 33 designates a $\overline{CAS}$ buffer, numeral 32 designates an address buffer, numeral 34 designates a preamplifier, numeral 35 designates a data input buffer and numeral 36 designates a main amplifier.

Furthermore, numerals 37, 38, 39 and 40 designate respectively a nibble mode control circuit, a static column mode control circuit, a normal page mode control circuit and a high speed page mode control circuit. These operation mode control circuits provide the operation modes shown in FIGS. 4(a), 4(b) and 4(c). It is to be noted however that the high speed page mode is omitted in the illustration. Numeral 41 designates the operation mode selection circuit in which four circuits of the type shown in FIG. 1, are included. Numerals 42 through 45 respectively designate transfer gates which may be made conductive by the output from the operation mode selection circuit 41.

FIG. 5 illustrates one way of wiring bonding pads. In FIG. 5, numeral 50 designates a package in which a chip 51 of the semiconductor memory device shown in FIGS. 3A and 3B is accommodated, numeral 52 designates a bonding pad for the chip 51, numeral 53 designates a group of pins, numeral 54 designates a group of terminals which are connected to the respective pins 53, and numeral 55 designates a wire.

Operation of the embodiment will now be explained by referring to FIG. 1. According to the present embodiment, a particular operation mode can be provided by effecting the wiring to the bonding pad 11 at the GND level or by cutting off the laser fuse 18 because the output node 16 of the NOR logic circuit 17 is kept at the GND level and then an internal or operation mode control circuit connected to the node 16 is kept at GND level.

In other words, when the wiring is not done or the fuse is not cut off, since the input of the inverter 13 is kept at the voltage level of the terminal 15 connected to the electric power source through the pull-up resistor 12 and the input Of the inverter 14 is also kept ar the voltage level of the terminal 15, two inputs of the NOR circuit 17 are at a low logic level and therefore the node 6 is at a high logic level.

Then, if the bonding pad 11 is wired to the GND level, the input of the inverter 13 is at a low logic level and one of the inputs of the NOR circuit 17 is at a high logic level, the node 16 consequently being at a low logic level.

The node 16 can also be put at a low logic level by cutting off the fuse 18 by means of a laser beam in place of the wiring of the bonding pad. Namely, the input of the inverter which was at a high logic level before the fuse 18 was cut off can be put at a low logic level by cutting off the fuse 18. Since this causes the other of the inputs of the NOR circuit 17 to be at a high logic level, the node 16 is then at a low logic level.

In this manner, since the node 1 connected to one of the transfer gates 42 through 45 can be put at a low logic level by wiring the pad 11 to the GND level or cutting off the fuse 18 by the laser beam, four different kinds of DRAM's can be provided by a single chip in a manner whereby only the required transfer gate, i.e. the one which corresponds to either the nibble mode control circuit 37, the static column mode control circuit 38, the normal page mode control circuit 39 or the high speed page mode control circuit 40, can be turned ON. It is also to be noted that since different chips can be provided not only by laser cutting but also by wiring the area occupied by the pad can be reduced compared to the prior art and a quick response to market requirements becomes possible. It is further noted that although the fuse 18 is cut off by a laser beam in the above-described embodiment, in the embodiment shown in FIG. 2, the electric fuse 20 can be cut off by applying a high level potential to the gate terminal 24 of the transistor 23, and exactly the same effect can be attained as in the embodiment described above.

It is further to be noted that although explanation has been given with respect to the nibble mode, the static column mode, the normal page mode and the high speed page mode in relation to the above-described embodiment as regards the four kinds of operation mode, other operation modes than the above including new operation modes which may be used in the future may naturally be employed also. It is also to be understood that the kinds of operation modes to which the invention is applicable should not be limited to the four kinds mentioned above and that it may be applied to any of a plurality of kinds.

It is further to be noted that the constitution of semiconductor chips to which this invention may be applied need not be limited to the one cited in the above-described embodiment and that any constitution can be employed if it contains a peripheral circuit capable of providing more than two kinds of operation modes with a single chip.

Although in the above-described embodiment, four of the operation mode selection circuits shown in FIG.

1 are included in correspondence with the operation modes available, it will be acceptable if at least two of these circuits are included. In this case, the outputs of said two operation mode selection circuits may be decoded. The invention is in general applicable provided that at least n number of operation mode selection circuits are included corresponding to $2^n$ kinds (n is a positive integral number) of operation modes.

Although in the above-mentioned embodiment, all the operation modes can be selected either by cutting off the fuse or by effecting the wiring, it is not absolutely necessary to provide both for all the operation modes and the operation modes can of course be selected simply by cutting off the fuse.

What is claimed is:

1. A semiconductor memory device characterized by a plurality of operation mode control circuit means provided on a memory chip of said device for respectively executing a corresponding plurality of writing/reading operation modes including at least a static column mode, a high speed page mode and a nibble mode, and a plurality of operation mode selection circuit means provided on said memory chip and which can be programmed in accordance with a predetermined pattern, each of the plurality of operation mode selection circuit means having a fuse element for enabling activation of a selected one of said plurality of operation mode control circuit means when a corresponding fuse element is cut off and having a bonding pad for enabling activation of the selected operation mode control circuit when a corresponding bonding pad is wired to a predetermined reference terminal, said fuse element and bonding pad being selected on a mutually exclusive basis.

2. A semiconductor memory device as set forth in claim 1, characterized in that each of said fuse elements can be cut off by a laser beam from an external laser trimmer apparatus.

3. A semiconductor memory device as set forth in claim 1, characterized in that each of said fuse elements can be cut off by an electric current from an external power source.

4. A semiconductor memory device as set forth in claim 1 wherein each of said operation mode selection circuit means further includes output circuit means for coupling an associated fuse element and bonding pad to a corresponding operation mode control circuit means.

5. A semiconductor memory device as set forth in claim 7 wherein each of said output circuit means comprises a logic circuit means for coupling a signal to a corresponding operation mode control circuit means either from an associated fuse element or from an associated bonding pad.

6. A semiconductor memory device as set forth in claim 5 wherein each of said output circuit means includes gate means.

7. A semiconductor memory device as set forth in claim 6 wherein each of said operation mode selection circuit means includes a first inverter having an input coupled to a corresponding bonding pad and a second inverter having an input coupled to a corresponding fuse element.

8. A semiconductor memory device as set forth in claim 7 wherein each of said logic circuit means comprises a NOR gate having one input coupled to the output of a corresponding first inverter and a second input coupled to the output of a corresponding second inverter, and including an output terminal.

* * * * *